(12) United States Patent
Stachowiak, Jr.

(10) Patent No.: US 10,830,795 B2
(45) Date of Patent: Nov. 10, 2020

(54) WATTHOUR METER BOX FLANGE AND METHOD FOR INSTALLATION OF SAME

(75) Inventor: John Edward Stachowiak, Jr., Houston, TX (US)

(73) Assignee: DeWalch Technologies, Inc., Houston, TX (US)

(*) Notice: Subject to any disclaimer, the term of this patent is extended or adjusted under 35 U.S.C. 154(b) by 0 days.

(21) Appl. No.: 12/284,975

(22) Filed: Sep. 25, 2008

(65) Prior Publication Data

US 2009/0154072 A1    Jun. 18, 2009

Related U.S. Application Data

(63) Continuation-in-part of application No. 11/265,339, filed on Nov. 2, 2005, now abandoned, which is a
(Continued)

(51) Int. Cl.
*H05K 5/00* (2006.01)
*G01R 11/04* (2006.01)
(Continued)

(52) U.S. Cl.
CPC .............. *G01R 11/04* (2013.01); *H02B 1/03* (2013.01); *H02B 1/28* (2013.01); *H02G 3/081* (2013.01); *H05K 5/00* (2013.01); *G01R 11/24* (2013.01)

(58) Field of Classification Search
USPC ....... 361/622, 641, 672, 627, 644–645, 654, 361/659–668, 679.46, 679.57–679.58,
(Continued)

(56) References Cited

U.S. PATENT DOCUMENTS 2,113,744 A    4/1938  Pixley et al.
3,617,814 A   11/1971  Stanback
(Continued)

FOREIGN PATENT DOCUMENTS

WO    8908588      9/1989
WO   200624540    3/2006

OTHER PUBLICATIONS

E-mail/Letter from Foreign Counsel dated Sep. 6, 2010 regarding Mexican Patent Office Office Action dated Jul. 26, 2010 in connection with Mexican Patent Application No. MX/A/2007/014215 (7 pages).
(Continued)

*Primary Examiner* — Courtney L Smith
(74) *Attorney, Agent, or Firm* — DeWalch Technologies, Inc.

(57) ABSTRACT

The present disclosure relates to an apparatus and methods for securing a box cover to a watt-hour meter box base. In certain embodiments, the apparatus consists of a unitary member incorporating a plurality of flange members adapted for securing at least a portion of a top of a watthour meter box lid to a portion of a top front flange of a watthour meter box base. In various other embodiments, the unitary member consists of a unitary member adapted to engage a portion of a meter box lid. In various other embodiments, the member includes integrated opposed tension-receiving members.

35 Claims, 11 Drawing Sheets

Related U.S. Application Data continuation-in-part of application No. 11/920,297, filed as application No. PCT/US2006/018335 on May 11, 2006.

(60) Provisional application No. 60/679,863, filed on May 12, 2005, provisional application No. 60/624,700, filed on Nov. 3, 2004.

(51) Int. Cl.
   *H02B 1/03* (2006.01)
   *H02B 1/28* (2006.01)
   *H02G 3/08* (2006.01)
   *G01R 11/24* (2006.01)

(58) Field of Classification Search
   USPC .................................. 361/688–690, 726, 732
   See application file for complete search history.

(56) References Cited

U.S. PATENT DOCUMENTS

| | | | | | |
|---|---|---|---|---|---|
| 4,080,811 | A | * | 3/1978 | Nielsen, Jr. | ...................... 70/164 |
| 4,120,182 | A | | 10/1978 | Michelman | |
| 4,146,258 | A | * | 3/1979 | Andruchiw | ................ 292/256.6 |
| 4,427,172 | A | * | 1/1984 | Cooper | .......................... 248/551 |
| 4,551,999 | A | | 11/1985 | Guiler | |
| 6,386,790 | B1 | | 5/2002 | Thiel et al. | |
| 6,421,229 | B1 | * | 7/2002 | Campbell et al. | ............ 361/622 |
| 2006/0217007 | A1 | | 9/2006 | Stachowiak | |
| 2006/0285281 | A1 | * | 12/2006 | Zhang et al. | .................. 361/659 |
| 2007/0205012 | A1 | * | 9/2007 | Stachowiak, Jr. | .............. 174/58 |
| 2009/0154072 | A1 | | 6/2009 | Stachowiak | |

OTHER PUBLICATIONS

E-mail/Letter from Applicant dated Dec. 17, 2010 in response to original E-mail/Letter from Foreign Counsel dated Sep. 6, 2010 regarding Mexican Patent Office Office Action dated Jul. 26, 2010 in connection with Mexican Patent Application No. MX/A/2007/014215 (11 pages).
E-mail/Letter from Foreign Counsel dated May 11, 2011 regarding Mexican Patent Office Office Action dated Mar. 29, 2011 in connection with Mexican Patent Application No. MX/A/2007/014215 (10 pages).
E-mail/Letter from Applicant dated Aug. 12, 2011 in response to original E-mail/Letter from Foreign Counsel dated May 11, 2011 regarding Mexican Patent Office Office Action dated Mar. 29, 2011 in connection with Mexican Patent Application No. MX/A/2007/014215 (10 pages).
E-mail/Letter from Foreign Counsel dated Sep. 29, 2011 regarding Notice of Allowance regarding Mexican Patent Application No. MX/A/2007/014215 (3 pages).
E-mail/Letter from Foreign Counsel dated Jan. 10, 2012 regarding Mexican Patent Divisional Application No. MX/a/2012/000497 filed on Jan. 9, 2012 claiming priority to parent Mexican Patent Application No. MX/A/2007/014215 (3 pages).
E-mail/Letter from Foreign Counsel dated Nov. 1, 2013 regarding the first Mexican Patent Office Office Action in connection with Mexican Patent Divisional Application No. MX/a/2012/000497 (7 pages).
E-mail/Letter from Applicant dated Feb. 11, 2014 in response to original E-mail/Letter from Foreign Counsel dated Nov. 1, 2013 regarding the first Mexican Patent Office Office Action in connection with Mexican Patent Divisional Application No. MX/a/2012/000497 (35 pages).
E-mail/Letter from Applicant dated Feb. 13, 2014 in response to original E-mail/Letter from Foreign Counsel dated Nov. 1, 2013 regarding the first Mexican Patent Office Office Action in connection with Mexican Patent Divisional Application No. MX/A/2012/000497 (19 pages).
E-mail/Letter from Applicant dated Feb. 14, 2014 in response to original E-mail/Letter from Foreign Counsel dated Nov. 1, 2013 regarding the first Mexican Patent Office Office Action in connection with Mexican Patent Divisional Application No. MX/a/2012/000497 (23 pages).
E-mail/Letter from Foreign Counsel dated Mar. 14, 2014 regarding Notice of Allowance regarding Mexican Patent Divisional Application No. MX/a/2012/000497 (2 pages).
International Search Report and Written Opinion dated Jun. 5, 2008 for PCT International Application No. PCT/US06/18335 filed May 11, 2006 (5 pages).
International Preliminary Report on Patentability dated Mar. 17, 2009 for PCT International Application No. PCT/US06/18335 filed May 11, 2006 (5 pages).
App. Biblio.—U.S. Appl. No. 11/265,339, filed Nov. 2, 2005 (2 pages).
App. Biblio.—PCT International Patent Application No. PCT/US2006/018335 filed May 11, 2006 (1 page).
App. Biblio.—U.S. Appl. No. 11/920,297, filed Nov. 13, 2007 (3 pages).
App. Corr.—E-mail/Letter from PATENTEC Search Firm dated Sep. 13, 2006 in connection with U.S. Appl. No. 11/265,339 (3 pages).
E-mail dated Jan. 6, 2012 from Foreign Counsel (Becerril, Coca & Becerril) regarding Divisional Application filing (for related Mexican Application No. MX/A/2007/014215 and Divisional Application MX/A/2007/000497)) (Fourteen (14) Pages).
E-mail dated Feb. 5, 2014 and attached Letters dated Jan. 5, 2014 and Nov. 1, 2013 from Foreign Counsel (Becerril, Coca & Becerril) regarding Mexican Institute of Industrial Property (MIIP) Office Action Letter (for related Mexican Application No. MX/A/2007/000497) (Eight (8) Pages).
Applicant's e-mail and attached MIIP Office Action Response dated Aug. 12, 2011 (for related Mexican Application No. MX/A/2007/014215) (Twenty Three (23) Pages).
E-mail dated Feb. 18, 2014 and attached Letter dated Feb. 18, 2014 from Foreign Counsel (Becerril, Coca & Becerril) regarding filing Office Action Response (for related Mexican Application No. MX/A/2007/000497) (Three (3) Pages).
Bibliographic Data Sheet dated Sep. 26, 2019 in connection with related U.S. Appl. No. 13/009,846)) ( 5 pages).
Requirement for Restriction dated Jul. 11, 2012, in connection with related U.S. Appl. No. 13/009,846)) (8 pages).
Applicant's Response to Election/Restriction dated Nov. 13, 2012 in connection with related U.S. Appl. No. 13/009,846)) (12 pages).
Notice of References Cited (Patents/Applications/Other) by Examiner and Non-Final Office Action dated Mar. 29, 2013 in connection with related U.S. Appl. No. 13/009,846)) (22 pages).
Applicant's Response to Non-Final Office Action with Amendments dated Sep. 30, 2013 in connection with related U.S. Appl. No. 13/009,846)) (29 pages).
Notice of References Cited (Patents/Applications/Other) by Examiner and Final Rejection dated Dec. 31, 2013 iin connection with related U.S. Appl. No. 13/009,846)) (25 pages).
Applicant's Response to Final Rejection with Amendment and RCE dated Jun. 30, 2014, in connection with related U.S. Appl. No. 13/009,846)) (30 pages).
Notice of References Cited (Patents/Applications/Other) by Examiner and Non-Final Office Action dated Jul. 18, 2014 in connection with related U.S. Appl. No. 13/009,846)) (30 pages).
Response to Non-Final Office Action dated Jan. 20, 2015 with Amendments in connection with related U.S. Appl. No. 13/009,846)) (25 pages).
Notice of References Cited (Patents/Applications/Other) by Examiner and Non-Final Rejection dated May 13, 2015 in connection with U.S. Appl. No. 13/009,846 in connection with related U.S. Appl. No. 13/009,846)) (18 pages).
Applicant's Response to Non-Final Rejection with Amendment dated Oct. 13, 2015 in connection with related U.S. Appl. No. 13/009,846)) (28 pages).
References Cited (Patents/Applications/Other) by Examiner and Final Rejection dated Jan. 21, 2016 in connection with related U.S. Appl. No. 13/009,846)) (19 pages).

(56) References Cited

OTHER PUBLICATIONS

Applicant's Response to Final Rejection with Amendment and RCE dated Jul. 16, 2016 in connection with related U.S. Appl. No. 13/009,846)) (32 pages).
Non-Final Rejection dated Jul. 27, 2016 in connection with related U.S. Appl. No. 13/009,846)) (18 pages).
Letter restarting period for Response dated Oct. 21, 2016 in connection with U.S. Appl. No. 13/009,846 (19 pages).
Response Non-Final Rejection dated Mar. 21, 2017 with Amendment iin connection with related U.S. Appl. No. 13/009,846)) (21 pages).
Final Rejection dated Jun. 20, 2017 in connection with related U.S. Appl. No. 13/009,846)) (20 pages).
Applicant's Response to after Final Office Action with Amendment, RCE and Suspension dated Apr. 27, 2018 in connection with related U.S. Appl. No. 13/009,846)) (62 pages).
References Cited (Patents/Applications/Other) by Examiner and Non-Final Rejection dated Jul. 12, 2018 in connection with related U.S. Appl. No. 13/009,846)) (16 pages).
Applicant's Response to Non-Final Rejection with Amendment dated Jan. 14, 2019 in connection with related U.S. Appl. No. 13/009,846)) (26 pages).
Final Rejection dated Apr. 29, 2019 n connection with related U.S. Appl. No. 13/009,846)) (6 pages).
Applicant Summary of Interview with Examiner dated Jun. 13, 2019 in connection with related U.S. Appl. No. 13/009,846)) (2 pages).

\* cited by examiner

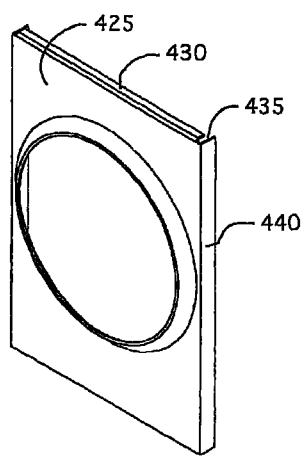
FIG. 10
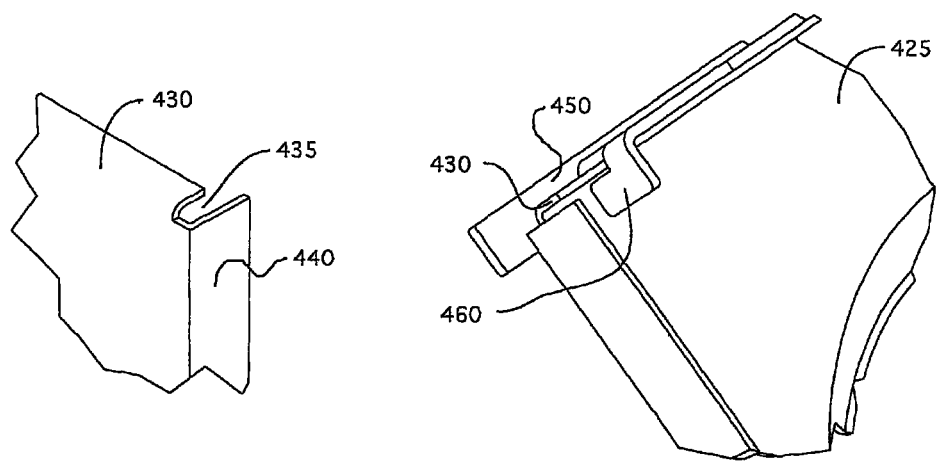
FIG. 10a
FIG. 11a

DETAIL D

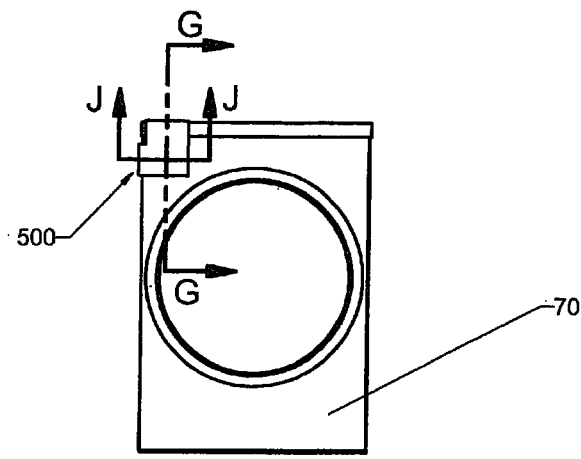
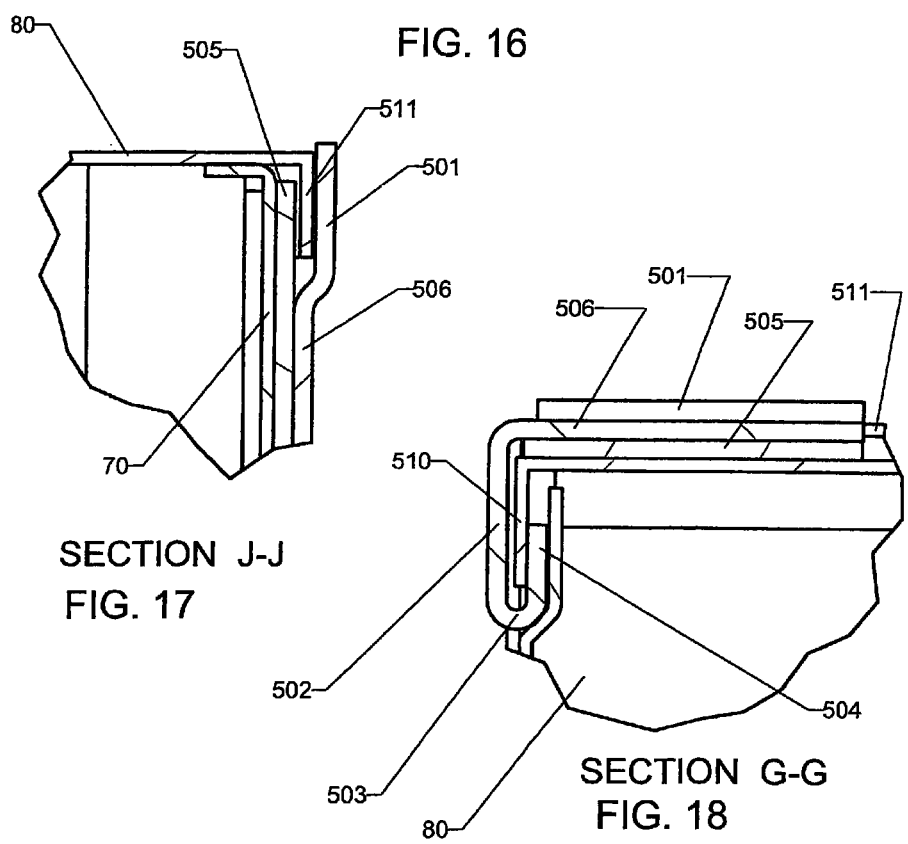

WATTHOUR METER BOX FLANGE AND METHOD FOR INSTALLATION OF SAME

CROSS-REFERENCE TO RELATED APPLICATIONS

This application is a continuation-in-part of application Ser. No. 11/265,339, filed Nov. 2, 2005, now abandoned which claims the benefit of U.S. Provisional Application No. 60/679,863, filed on May 12, 2005 and U.S. Provisional Application No. 60/624,700, filed on Nov. 3, 2004. This application also is a continuation-in-part of application Ser. No. 11/920,297, which is a national stage of International Application No. PCT/US2006/018335, filed May 11, 2006.

All written material, figures, content and other disclosure in each of the above-referenced applications is hereby incorporated by reference.

BACKGROUND OF THE INVENTION

Watthour meters measure electricity usage. Watthour meter boxes protect watthour meters from such things as the weather; human contact, for safety reasons; and tampering. Tampering may include prying the meter box open to bypass the meter to prevent electric usage from being recorded or illegally reinstating service after it has been disconnected. FIG. 1 shows a typical watthour meter box assembly consisting of meter box base 10 and box lid 30. Meter box base 10 provides structural and electrical interfaces, not shown, to meter 20. Under normal usage conditions, meter box door 30 is installed over meter 20, under the meter box front flange 40 and around the side and bottom edges 15 of base 10, the combined parts to be herein known as a meter box assembly. The door is typically locked or secured into place by locking mechanisms (not shown) well known in the art.

It has become apparent in the electric revenue protection industry that one weak point in the watthour meter box assembly is the front flange 40 formed into the top of base 10. If the flange or lip 40 is pried upward, away from installed lid 30, not currently shown as installed, the lid may be slipped off base 10 from the top 25, bypassing the typical locking systems, not shown, that secure the door 30 to base 10. If there were a way to prevent such tampering or to strengthen lip 40, the assembly would be made more secure.

One way to strengthen the lip 40 is to increase the gauge or thickness of the metal from which the lip or entire base is made. A higher gauge metal would be more difficult to bend, leading to a more secure assembly. In the vast number of current installations however, installing higher gauge bases to achieve the desired increased security would likely be too expensive to implement on a large scale due to the considerable effort required to remove and replace each base. Additionally, increasing the material thickness would not deter or prevent tampering with the base flange. There is a desire in the industry to find a solution for the above described security issues without necessarily having to remove and replace watthour meter box bases. If there were a way to add structure or prevent access to the top flange or lip of a meter box base by designing a new lid, not shown, or by designing an additional structure, not shown, disposed between the top of the lid and base, the box assembly's overall security could be improved, old installations could be upgraded without necessarily removing and replacing the meter box base and overall losses to electric providers could be reduced by preventing electricity theft.

Several examples of patents and a publication which disclose attempts to solve some of the above problems are set forth as follows.

U.S. Pat. No. 4,872,847 to Fennell, entitled "Pilfer Proofing System for Electric Utility Meter Box," is directed to a pilfer proofing system for electric meter boxes having a meter base box which carries a plug-in terminal block set and a meter box cover having an opening through which a plug-in meter passes to engage contact female or socket terminals in a terminal block set. A contact terminal block adaptor carrying insulating cages frictionally retained in the female socket terminal of the contact block set springs are included in the female socket terminals to assure continuous electrical contact and avoid hot spots. The meter box has a pair of lateral meter stops which are clamped between one end of an annular, cast aluminum ring and a pair of insulated, bifurcated clamp bars positioned behind the meter stops which, in turn, are secured to a common metal bar housed in a recess in the adaptor. The illustrate clamp bars have bifurcated ends which more evenly distributes the mechanical forces to the meter box by providing a plurality of distributed contact or load distribution points instead of one. An annular flange on the aluminum ring seals the edges of the existing opening in the meter cover thereby preventing surreptitious access to the interior of the meter box housing and, at the same time, clamping the rest of the meter cover securely to the box with the bifurcated clamp bars providing the plurality of distributed contact points; the teachings of which are incorporated by reference. This reference is incorporated by reference herein.

U.S. Pat. No. 4,404,521 to Fennell, entitled "Pilfer Proofing System for Electric Utility Meter Box," sets forth a pilfer proofing system and method for electric meter boxes having a meter base box, which carries a plug-in terminal block set and a meter box cover having an opening through which a plug-in-meter passes to engage contact jaws or sockets the terminal block set. An anchoring bar is secured to the meter stops and a conventional meter locking collar is secured to the cover and the bridge of the locking collar is secured to the anchoring bar. Metal extension adaptors are secured to the meter blades for entering into the contact jaws or sockets of the terminal block set and a conventional locking ring is utilized to lock the meter in place on the added meter collar thereby providing a substantial obstacle to easy pilfering of electricity. A safety device constituted by a handle, a flexible insulating sheet and a set of nonconductive blades is inserted in the socket blades of the terminal block set and retained therein by friction covering up the hot or live terminals of the terminal block set with the flexible insulating sheet, and it is removed by grasping the handle and removing same. This reference is incorporated by reference herein.

U.S. Pat. No. 5,870,911 to DeWalch, entitled "Electric Meter Box Lock," provides that a lock for meter boxes and similar enclosures includes an outer case with a central bore mounted on an electric meter box. Inside the bore are two extrusions of unequal length spaced 90 degrees apart. A sleeve having a deep bore is held in the case by a screw, and a spring assembly transmits motion from the screw to the sleeve. The sleeve includes a flange at its end with an arcuate cutout portion which spans both extrusions. The sleeve further includes several internal grooves for retaining a barrel type lock which prevents access to the screw. A heavy cover plate is welded to the top of the sleeve so that it overlays and retains the door of the meter box. To unlock the meter box lock, the barrel lock is removed to allow access to the screw. As the screw is unscrewed, the sleeve moves with the screw until the flange on the sleeve clears the shorter extrusion. The sleeve then rotates with the screw until the flange engages the longer extrusion. In this position, the cover plate no longer overlays the door, and the door can be opened. This reference is incorporated by reference herein.

U.S. Pat. No. 4,427,172 to Cooper, entitled "Frame for Tamper Proofing a Meter Housing," sets forth a rigid frame attachment for resisting tampering with an electrical meter. Angle irons enframe the meter face, with frame portions extending rearwardly along a lateral wall of the meter housing to rear frame portions engaging the rear wall of the housing. The front of the frame is attached, as by a lock, to the meter front wall at a point spaced from the side walls of the housing. This reference is incorporated by reference herein.

U.S. Pat. No. 6,421,229 to Campbell, entitled "Combination Meter/Breaker Panel Enclosure with Rain Gutter and Security System," sets forth a meter/breaker arrangement having separate covers for the meter side and breaker side. The meter side includes as an extension thereof a rain gutter which underlaps a flange on the breaker cover to provide a rain-proof or water-proof enclosure when both covers are disposed securely on the enclosure. In addition, a locking arrangement is provided so that the breaker cover can be removed without allowing access to the meter region. Alternatively, both the meter cover and breaker cover can be removed. A flexible, partially non-electrically conductive, security member is provided for separating the meter side from the breaker side. This reference is incorporated by reference herein.

U.S. Pat. No. 6,498,717 to Matthews, entitled "Surface Mounted Panel Adpater for a Socket Mounted Electricity Meter," sets forth a surface mounted panel adapter for a socket mounted electricity meter that allows a socket mounted electricity meter to be installed on a switchboard. The surface mounted panel adapter is designed to attach to the back of a switchboard, and to expose a meter socket which is mounted on the front wall of the surface mounted panel adapter and which is exposed through the front wall of the switchboard. A standard socket mounted electricity meter can be mounted in the meter socket through the opening in the switchboard. Electrical connections to the meter socket are made using at least one terminal strip mounted on the rear wall of the panel adapter, and readily accessible to an installer who is behind the switchboard panel. This reference is incorporated by reference herein.

PCT International Application Publication No. PCT/GB1989/00275 to Calvert, entitled "Containers with Tamper Evident Closures," sets forth a tamper evident band (16) (as noted the drawings) provided around an area of cooperation between a container mouth (18) and a closure cap (11). Sloping faces (15) and (24) on the container and cap respectively allow the cap, surrounded by the strip (16) to be pushed on to the container, but shoulders (14) and (23) prevent subsequent removal of the cap without first removing the band (16). When the band (16) is removed, the cap can expand radially when pulled upwardly to release the engagement between the shoulders (14) and (23), and so allow removal of the cap. The cap and band (16) may be moulded together from a plastics material, with the band (16) depending from the edge of the cap and being attached thereto by a frangible portion (17, FIG. 1). At some point prior to, or during the assembly with the container, the frangible portion is broken and the band (16) moved to surround the cap as shown. This reference is incorporated by reference herein.

(It should be noted that any patent, publication or other information referred to above or herein is not intended to constitute an admission that such patent, publication or other information is in fact "material" or "prior art" for the present invention unless specifically designated as such).

There remains a need for a method and apparatus for deterring forced entry into a utility service enclosure that is readily installable—for example, without having to replace the utility service enclosure. There is a need for a device capable of securing a utility service enclosure, or for example a meter box securing device, that is adapted for reinforcing a lid-retaining member of the enclosure and which can be retained on a utility service enclosure so as to strengthen the enclosure to prevent tampering therewith. There is a further need for a securing device having a unitary configuration (or, for example, a configuration having multiple parts that are combinable and/or separable) and adapted to be disposed or retained between the top of, for example, a meter box lid and base to deter access to the top flange of a meter box base so as improve the overall security of the meter box or utility service enclosure.

Those of skill in the art will appreciate the present invention which addresses the above needs and other significant needs the solution to which are discussed hereinafter.

SUMMARY OF THE INVENTION

According to one embodiment of the invention, an apparatus for securing a box cover to a watt-hour meter box is provided, the apparatus including at least a unitary member incorporating a plurality of flange members, the member being adapted for securing a top portion of a watthour meter box lid to a portion of top front flange of a watthour meter box base.

According to a further embodiment of the invention, there is also provided a method for securing a box cover to a watt-hour meter box including at least disposing a unitary member incorporating a plurality of flange members between a portion of a top of a meter box lid and a portion of a top flange of a meter box base, the member being adapted for securing the portion of the top of the watthour meter box lid to the portion of the top front flange of the watthour meter box base.

Another example embodiment provides an apparatus for deterring forced entry into a utility service enclosure, the apparatus including at least: a securing member adapted to be retained on the utility service enclosure, the utility service enclosure having a lid, a base and a lid-retaining member, the securing member having a structural member for reinforcing a lid-retaining member.

In another example embodiment of the apparatus, the lid-retaining member includes at least a portion of a top of the utility service enclosure.

In another example embodiment of the apparatus, the securing member is retained on the utility service enclosure via a retaining flange adapted to engage a portion of a top of the utility service enclosure lid.

In another example embodiment of the apparatus, the securing member further includes at least a structural element adapted to receive a top front flange of the utility service enclosure base.

In another example embodiment of the apparatus, the securing member is retained on the utility service enclosure via at least one fastener.

In another example embodiment of the apparatus, the lid-retaining member includes at least a top front flange of the utility service enclosure base.

In another example embodiment of the apparatus, the lid-retaining member includes at least a portion of a top of the utility service enclosure lid.

In another example embodiment of the apparatus, the securing member is adapted to secure a portion of a top of the utility service enclosure lid to a portion of a top front flange of the utility service enclosure base.

In another example embodiment of the apparatus, a first portion of the securing member is shaped to engage a portion of a top flange of the utility service enclosure base.

In another example embodiment of the apparatus, a second portion of the securing member is shaped to engage a portion of a top of the utility service enclosure lid.

In another example embodiment of the apparatus, the second portion substantially surrounds the portion of the top of the lid.

In another example embodiment of the apparatus, the securing member is combined with a utility service enclosure lid such that the lid and securing member are one integrated piece.

In another example embodiment of the apparatus, the securing member is combined with a utility service enclosure base such that the base and securing member are one integrated piece.

In another example embodiment of the apparatus, the securing member is made from steel.

In another example embodiment of the apparatus, the steel is hardened.

In another example embodiment of the apparatus, the securing member is coated with a material having low electrical conductivity.

In another example embodiment of the apparatus, the material includes at least a powder coat.

In another example embodiment of the apparatus, the material includes at least rubber.

In another example embodiment of the apparatus, the securing member further includes at least a first, second and third flange member, wherein the first and second flange members are generally parallel to each other, and wherein the third flange member is generally perpendicular to the first and the second flange members.

In another example embodiment of the apparatus, the third flange member is shaped to engage the top portion of a utility service enclosure lid.

In another example embodiment of the apparatus, the apparatus includes at least a fourth flange member wherein the fourth member acts as an integrated opposed tension-receiving member.

In another example embodiment of the apparatus, the apparatus includes at least a plurality of flange members, each flange member acting as an integrated opposed tension-receiving member.

In another example embodiment of the apparatus, the fourth flange member lies in a plane at least substantially orthogonal with respect to the third flange member, wherein a top portion of the utility service enclosure lid comprises a top lip, the third flange member and the fourth flange member defining a slot and at least a portion of the top lip being releaseably captured within the slot whereby the securing member may be retained between the top front flange of the utility service enclosure base and the top lip of the utility service enclosure lid, and such that when the securing member is subjected to prying forces, the fourth flange member and third flange member cooperate to pinch the top lip therebetween so as to counter the prying forces, and such that the third flange member and fourth flange member cooperatively retain the securing member on the top lip of the utility service enclosure lid so as to aid in preventing the securing member from inadvertently falling into the interior of the utility service enclosure.

In another example embodiment of the apparatus, the second, third, and fourth flange member are cooperatively attachable to the top lip of the utility service enclosure lid so as to aid in preventing the securing member from being inadvertently detached upon removal or installation of the utility service enclosure lid.

In another example embodiment of the apparatus, the third flange member is in functional cooperation with the fourth flange member to inhibit deformation of structural member when subject to prying or other forces.

In another example embodiment of the apparatus, the apparatus further includes at least a plurality of flange members, each flange member acting as an integrated opposed tension-receiving member.

In another example embodiment of the apparatus, the securing member includes at least a structural member having at least one of two different configurations, said first configuration being adapted for substantially surrounding the lid-retaining member, and said second configuration being adapted for engaging the lid-retaining member.

In another example embodiment of the apparatus, the securing member includes at least a structural member having at least one of two other different configurations, said third configuration being adapted for selectively contacting the lid-retaining member, and said fourth configuration being adapted for being disposed on the lid-retaining member.

Another example embodiment provides a system for deterring forced entry into a utility service enclosure including at least: means for retaining a securing member on the utility service enclosure, the utility service enclosure including at least a lid, a base and a lid-retaining member; and means for reinforcing the lid-retaining member with the securing member.

In another example embodiment of the system, the lid-retaining member includes at least a portion of a top of the utility service enclosure.

In another example embodiment of the system, the means for retaining the securing member on the utility service enclosure includes at least a retaining flange adapted to engage a portion of a top of the utility service enclosure lid.

In another example embodiment of the system, the means for reinforcing a lid-retaining member includes at least a structural element adapted to receive a top front flange of the utility service enclosure base.

In another example embodiment of the system, the means for retaining the securing member on the utility service enclosure includes at least at least one fastener.

In another example embodiment of the system the lid-retaining member includes at least a top front flange of a utility service enclosure base.

In another example embodiment of the system, lid-retaining member includes at least a portion of a top of the utility service enclosure lid.

In another example embodiment of the system, the securing member is adapted to secure a portion of a top of a utility service enclosure lid to a portion of a top front flange of a utility service enclosure base.

In another example embodiment of the system, the means for reinforcing a lid-retaining member is shaped to engage a portion of a top flange of the utility service enclosure base.

In another example embodiment of the system, the means for retaining the securing member is shaped to engage a portion of a top of the utility service enclosure lid.

In another example embodiment of the system, the means for retaining the securing member substantially surrounds the portion of the top of the lid.

In another example embodiment of the system, the securing member is combined with a utility service enclosure lid such that the lid and securing member are one integrated piece.

In another example embodiment of the system, the securing member is combined with a utility service enclosure base such that the base and securing member are one integrated piece.

In another example embodiment of the system, the securing member is made from steel.

In another example embodiment of the system, the steel is hardened.

In another example embodiment of the system, the securing member is coated with a material having low electrical conductivity.

In another example embodiment of the system, the material includes at least a powder coat.

In another example embodiment of the system, the material includes at least rubber.

In another example embodiment of the system, the securing member further includes at least a first, second and third flange member, wherein the first and second flange members are generally parallel to each other, and wherein the third flange member is generally perpendicular to the first and the second flange members.

In another example embodiment of the system, the third flange member is shaped to engage the top portion of a utility service enclosure lid.

In another example embodiment of the system, the system further includes at least a fourth flange member wherein the fourth member acts as an integrated opposed tension-receiving member.

In another example embodiment of the system, the system the further includes at least a plurality of flange members, each flange member acting as an integrated opposed tension-receiving member.

Another example embodiment provides a method for deterring forced entry into a utility service enclosure including at least: retaining a securing member on the utility service enclosure, the utility service enclosure including at least a lid, a base, and a lid-retaining member; and reinforcing the lid-retaining member with the securing member.

In another example embodiment of the method the lid-retaining member includes at least a portion of a top of the utility service enclosure.

In another example embodiment of the method, the lid-retaining member includes at least a top front flange of the utility service enclosure base.

In another example embodiment of the method, the lid-retaining member includes at least a portion of a top of the utility service enclosure lid.

In another example embodiment of the method, the securing member is in functional cooperation with a portion of the utility service enclosure base.

In another example embodiment of the method, the securing member is in functional cooperation with a portion of the utility service enclosure lid.

In another example embodiment of the method, the securing member is disposed by hand.

In another example embodiment of the method, the securing member is disposed by welding.

In another example embodiment of the method, the securing member is disposed via at least one fastener.

In another example embodiment of the method, the securing member is disposed by adhesive.

In another example embodiment of the method, the securing member is disposed using a hand held tool.

In another example embodiment of the method, the securing member is disposed using industrial tooling.

In another example embodiment of the method, the securing member includes at least a structural member having at least one of two different configurations, said first configuration being adapted for substantially surrounding the lid-retaining member, and said second configuration being adapted for engaging the lid-retaining member.

In another example embodiment of the method, the securing member includes at least a structural member having at least one of two other different configurations, said third configuration being adapted for selectively contacting the lid-retaining member, and said fourth configuration being adapted for being disposed on the lid-retaining member.

An example embodiment of a method for strengthening and/or securing a utility service enclosure includes at least interengaging a reinforcing member between a structural portion of a utility service enclosure lid and a structural portion of a utility service enclosure base, wherein the reinforcing member is adapted to secure the structural portion of the utility service enclosure lid and the structural portion of the utility service enclosure base.

An example embodiment of a method for strengthening and/or securing a utility service enclosure includes at least reinforcing and/or interengaging a structural portion of a utility service enclosure lid and a structural portion of a utility service enclosure base, wherein the reinforcing and/or interengaging cooperatively secures the structural portion of the utility service enclosure lid and the structural portion of the utility service enclosure base.

An example embodiment of a system for strengthening and/or securing a utility service enclosure includes at least means for reinforcing and/or interengaging a structural portion of a utility service enclosure lid and a structural portion of a utility service enclosure base, wherein the means for reinforcing and/or interengaging cooperatively secures the structural portion of the utility service enclosure lid and the structural portion of the utility service enclosure base.

An example embodiment of a system for strengthening and/or securing a utility service enclosure includes at least means for reinforcing and/or interengaging a structural portion of a utility service enclosure lid and a structural portion of a utility service enclosure base, wherein the means for reinforcing and/or interengaging cooperatively inhibits relative deformation of the structural portion of the utility service enclosure lid and the structural portion of the utility service enclosure base.

An example embodiment of an apparatus for strengthening and/or securing a utility service enclosure includes at least a member to reinforce and/or interengage a structural portion of a utility service enclosure lid and a structural portion of a utility service enclosure base, wherein the member to reinforce and/or interengage cooperatively inhibits relative deformation of the structural portion of the utility service enclosure lid and the structural portion of the utility service enclosure base.

An example embodiment of a apparatus for strengthening and/or securing a utility service enclosure includes at least a reinforcing member adapted to securely interengage a structural portion of a utility service enclosure lid to a structural portion of the utility service enclosure base, wherein the reinforcing member cooperatively secures the structural portion of the utility service enclosure lid and the structural portion of the utility service enclosure base.

In another example embodiment of the apparatus for strengthening and/or securing a utility service enclosure, the reinforcing member further includes at least a receiving member, the receiving member being adapted to substantially surround a structural portion of the utility service enclosure base when the utility service enclosure lid is installed onto the utility service enclosure base.

An example embodiment of a apparatus for strengthening and/or securing a utility service enclosure includes at least a reinforcing member adapted to securely interengage a structural portion of a utility service enclosure lid to a structural portion of the utility service enclosure base, wherein the reinforcing member cooperatively secures the structural portion of the utility service enclosure lid and the structural portion of the utility service enclosure base, and/or wherein the reinforcing member further includes at least a receiving member, the receiving member being adapted to substantially surround a structural portion of the utility service enclosure base when the utility service enclosure lid is installed onto the utility service enclosure base.

An example embodiment of an apparatus for strengthening and/or securing a utility service enclosure includes at least a reinforcing member formed to securely interengage a structural portion of a utility service enclosure lid to a structural portion of the utility service enclosure base, wherein the reinforcing member is in functional cooperation with the structural portion of the utility service enclosure base to reinforce the utility service enclosure.

Another example embodiment of an apparatus for strengthening and/or securing a utility service enclosure includes at least a reinforcing member formed to securely interengage a structural portion of a utility service enclosure lid to a structural portion of the utility service enclosure base, wherein the reinforcing member is in functional cooperation with the structural portion of the utility service enclosure lid and the structural portion of the utility service enclosure base to reinforce the utility service enclosure.

Another example embodiment of a method for installing a security device on a watthour meter box includes at least: disposing a unitary member incorporating a plurality of flange members between a portion of a top of a meter box lid and a portion of a top flange of a meter box base, wherein the unitary member is adapted for securing the portion of the top of the watthour meter box lid to the portion of the top front flange of the watthour meter box base.

In another example embodiment of the method, the member is in functional cooperation with a portion of the meter box base.

In another example embodiment of the method, the member is in functional cooperation with a portion of the lid.

In another example embodiment of the method, the member is disposed by hand.

In another example embodiment of the method, the member is disposed by welding.

In another example embodiment of the method, the member is disposed via fasteners.

In another example embodiment of the method, the member is disposed using a hand held tool.

In another example embodiment of the method, the member is disposed using industrial tooling.

Another example embodiment provides a watthour meter box security device, the watthour meter box including at least a typical watthour meter box assembly having an interior, the watthour meter box assembly including at least a watthour meter box base and a watthour meter box lid, the base including at least bottom edges and a top front flange and the lid including at least a top portion, bottom portion, and side portions, wherein a portion of the top portion of the watthour meter box lid is disposed under the top front flange, and wherein the top front flange is disposed exterior to the portion of the top portion of the watthour meter box lid, the security device including at least: a unitary member including at least a plurality of flange members, wherein the unitary member secures a portion of the top portion of the watthour meter box lid to a portion of the top front flange of the watthour meter box base; and wherein a first portion of the unitary member is shaped to engage the portion of the top front flange of the watthour meter box base.

In another example embodiment of the security device, a second portion of the unitary member is shaped to engage the portion of the top portion of the watthour meter box lid.

In another example embodiment of the security device, the second portion catchably surrounds the top portion of the watthour meter box lid.

In another example embodiment of the security device, the unitary member is combined with the watthour meter box lid such that the watthour meter box lid and unitary member are one integrated piece.

In another example embodiment of the security device, the unitary member is made from steel.

In another example embodiment of the security device, the steel is case hardened.

In another example embodiment of the security device, the unitary member is coated with a material having low electrical conductivity.

In another example embodiment of the security device, the material is a powder coat.

In another example embodiment of the security device, the material is rubber.

Another example embodiment provides a watthour meter box security device, the watthour meter box including at least a typical watthour meter box assembly having an interior, the watthour meter box assembly including at least a watthour meter box base and a watthour meter box lid, the base including at least bottom edges and a top front flange and the lid including at least a top portion, bottom portion, and side portions, wherein a portion of the top portion of the watthour meter box lid is disposed under the top front flange, and wherein the top front flange is disposed exterior to the portion of the top portion of the watthour meter box lid, the security device including at least: a unitary member including at least a plurality of flange members, wherein the unitary member secures a portion of a top portion of a watthour meter box lid to a portion of a top front flange of a watthour meter box base; and wherein a first portion of the unitary member is shaped to engage the portion of the top front flange of the watthour meter box base.

The content and disclosure of each of the following applications/publications to the extent permitted are specifically hereby incorporated by reference: U.S. patent application Ser. No. 11/265,339, filed Nov. 2, 2005; U.S. Provisional Application No. 60/679,863, filed on May 12, 2005; U.S. Provisional Application No. 60/624,700, filed on Nov. 3, 2004; U.S. application Ser. No. 11/920,297, filed on Nov. 11, 2007 (which is a national stage of International Application No. PCT/US2006/018335, filed May 11, 2006); International Application No. PCT/US2006/018335, filed May 11, 2006.

These and other objects, features, and advantages of example embodiments of the present invention will become apparent from the drawings, the descriptions given herein, and the appended claims. Further objects are also indicated herein in various example embodiments of the invention. However, it will be understood that the above-listed objectives and/or advantages of example embodiments are intended only as an aid in quickly understanding aspects of the example embodiments, are not intended to limit the embodiments of the invention in any way, and therefore do not form a comprehensive or restrictive list of objectives, and/or features, and/or advantages.

There has thus been outlined, rather broadly, features of example embodiments of the invention in order that the detailed description thereof may be better understood, and in order that the present contribution to the art may be better appreciated. There are additional features of example embodiments of invention that will be described hereinafter.

In this respect, before explaining at least one example embodiment of the invention in detail, it is to be understood that the example embodiments are not limited in its application to the details of construction and to the arrangements of the components set forth in the following description or illustrated in the drawings. Various example embodiments are capable of other further embodiments and of being practiced and carried out in various ways. Also, it is to be understood that the phraseology and terminology employed herein are for the purpose of the description and should not be regarded as limiting.

To the accomplishment of the above and related objects, example embodiments of the invention may be embodied in the form illustrated in the accompanying drawings, attention being called to the fact, however, that the drawings are illustrative only, and that changes may be made in the specific construction illustrated.

BRIEF DESCRIPTION OF THE DRAWINGS

The drawings as noted below form part of the present specification and are included to further demonstrate certain aspects of example embodiments of the invention. Various other objects, features and attendant advantages of the embodiments of the invention will become fully appreciated as the same becomes better understood when considered in conjunction with the accompanying drawings, in which like reference characters designate the same or similar parts throughout the several views, and wherein:

FIG. 5b is three dimensional view of the same example embodiment from FIG. 5a.

FIG. 7b shows a top view of the same example embodiment from FIG. 7a.

FIG. 10 is a view from a typical watthour meter box door.

FIG. 10a is a close up section view of the same meter box door.

FIG. 11a shows a rear section view of the same door with one example embodiment of the present invention in stalled on the door's top.

FIG. 16 shows a front view of the alternative embodiment installed onto a watthour meter box.

FIG. 17 shows an isolated section view of the alternative embodiment installed onto a watthour meter box.

FIG. 18 shows yet another isolated section view of the alternative embodiment installed onto a watthour meter box.

While various example embodiments of the invention will be described herein, it will be understood that it is not intended to limit the invention to those embodiments. On the contrary, it is intended to cover all alternatives, modifications, and equivalents included within the spirit of the invention and as defined in the appended claims.

DETAILED DESCRIPTION OF THE INVENTION

Figure 1:
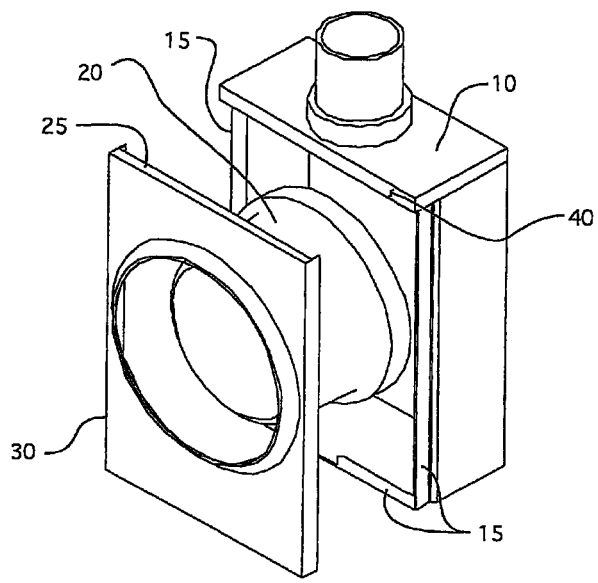
FIG. 1 is a partially exploded view of a representative prior-art meter box and meter assembly.
Figure 2:
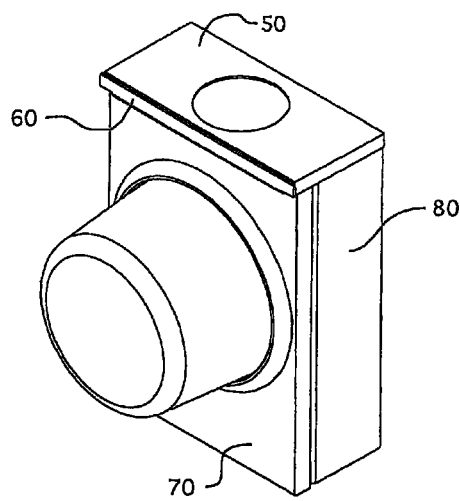
FIG. 2 is a watthour meter box assembly with one example embodiment of an installed security bracket.

Turning now to FIG. 2, shown is one embodiment of the present invention. A typical watt hour meter box assembly 50 is shown with a security member 60 present between the lid 70 and base 80. The security member is adapted to reinforce the lid-retaining member such as 40 as shown in FIG. 1. The lid-retaining member in this example is a flange that is part of the meter base and engages the upper portion of the lid generally in the area adjacent 25. A function of a lid-retaining member is to assist in holding the lid in place when the lid is generally in the closed position. Other utility service enclosures can include other types of lid-retaining members. Other lid-retaining member examples include but are not limited to structures on the lid that engage the base, structures on the base that engage the lid, and hinged assemblies on either the base or the lid or both. The specific design of the lid-retaining member can vary widely and still be with in the scope of the invention. In one embodiment of the present invention, security member 60 is a unitary member incorporating a plurality of flanges. In this embodiment, the flanges are configured in such a way as to protect the front flange of the meter box base. In other embodiments of the present invention, the flanges are configured to protect the front flange of the meter box base and to secure the watthour meter box security member or "bracket" to the meter box lid upon lid removal. In other example embodiments, the bracket is incorporated into the lid where the lid and bracket are one part so that when the lid is installed onto a base, the front flange of the meter box base is protected. These and other embodiments are discussed in more detail below.

Figure 3:
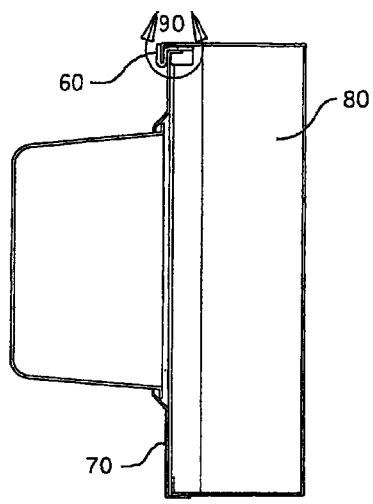
FIG. 3 is a side cut away view of the box assembly from FIG. 2.
Figure 4A:
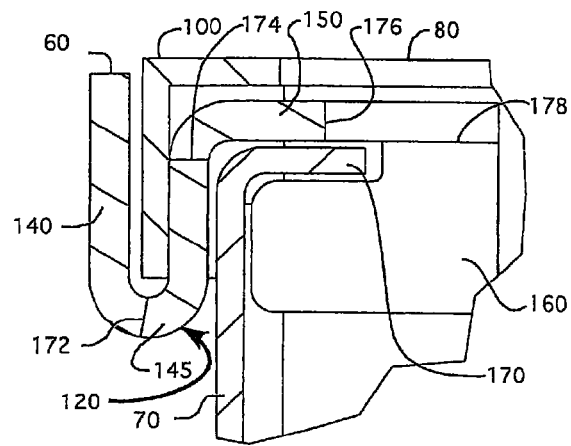
FIG. 4a is a section view from the box assembly in FIG. 3, showing one example embodiment of the present invention.

FIG. 3 shows a side cut away view of one embodiment of the present invention where base 80 and lid 70 have bracket 60 disposed between them. Turning now to FIG. 4a, section 90 from FIG. 3 is isolated showing one example embodiment of the present invention. Here, bracket 60 is disposed between the top front meter box base flange 100 and the meter box lid 70. The bracket 60 is comprised of multiple flanges that are adapted for securing a top portion of lid 70 to a portion of top front flange 100 of base 80. Bracket 60 includes substantially parallel flanges 140 and 145, also known as front flange 140 and rear flange 145; generally perpendicular flange 150; and bracket securing flange 160. As shown in this embodiment, parallel flanges 140 and 145 surround or encase at least a portion of the front meter box flange 100, effectively preventing access to the "underside" of base flange 100 and adding additional structure to flange 100 when lid 70 is installed onto base 80 in conjunction with bracket 60. It should be noted that after installation, even though parallel flange 145 is shown in FIG. 4a contacting base flange 100, this contact is not required for purposes of installation. Any portion or surface of flange 60 may be touching any portion or surface of lid 70 or base 80 depending on the box assembly's installation orientation and depending on the affects of gravity on that installation and bracket 60. Alternatively, in some embodiments, flanges 140 and 145 "pinch" lip 170, aiding in installation as discussed below. In the embodiment shown in FIG. 4a, bracket securing flange 160 surrounds at least a portion of the lid lip or flange 170, at least loosely securing bracket securing flange 160 to box lid 70. The effect of this arrangement has the added benefit when the meter box lid 70 is removed from a meter box base 80, the bracket securing flange 160 helps prevent bracket 60 from disengaging from the meter box lid 70 and dropping inside the meter box base 80, a condition that could potentially result in a dangerous electrical situation.

In various embodiments of the present invention, bracket securing flange 160 acts as an integrated opposed tension-receiving member. In these embodiments, securing flange 160 is sized such that when a prying force 120 is applied, generally as shown, to flange segment 145, securing flange 160 distributes some of the force 120 into door 70, requiring the force 120 to overcome not only the opposing forces required to bend lip 100 and flange segments 140 and 145 but also the forces required to deform door 70 sufficiently to disengage security bracket 60 from the door 70, before the door 70 can be removed from the top of the box base.

In various embodiments of the present invention, each flange segment 140, 145, 150, and 160 is made from separate and distinct materials and combined into a unitary member incorporating the plurality of flanges. In various other embodiments of the present invention, flange segments 140, 145, 150 and 160 are interchangeably made from various materials and combined into a unitary member incorporating the plurality of flanges. In another embodiment, flange segments 140, 145, 150, and 160 are made from the same material and combined into a unitary member incorporating the plurality of flanges. All known methods, without limitation, of combining the flange segments described in the various embodiments, herein described, where flange segments are separate pieces, including but not limited to welding, bonding, and mechanical connection are herein incorporated by reference. Welding, bonding, and mechanical connection being only illustrative examples meant as a simple, partial list of all known joining techniques known to those with skill in the art. In another embodiment, flange segments 140, 145, 150, and 160 are made from the same piece of material, shaped into a unitary member incorporating the plurality of flanges.

In addition, in various other embodiments, portions of the unitary member, selected flanges and/or all of the flanges or the unitary member may be made from rigid and/or substantially rigid material which may include metal, plastic, composite materials, or other material known to a person of ordinary skill in the art. The properties of such material in some embodiments should be sufficient for the various reinforcing, strengthening and/or securing purposes as noted herein.

Figure 5A:
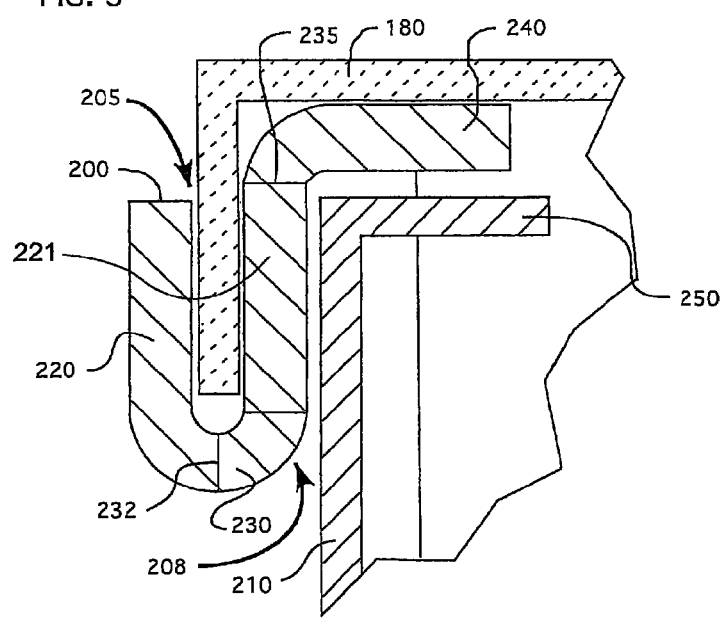
FIG. 5a is a section view from the box assembly in FIG. 3, showing another example embodiment of the present invention.
Figure 5B:
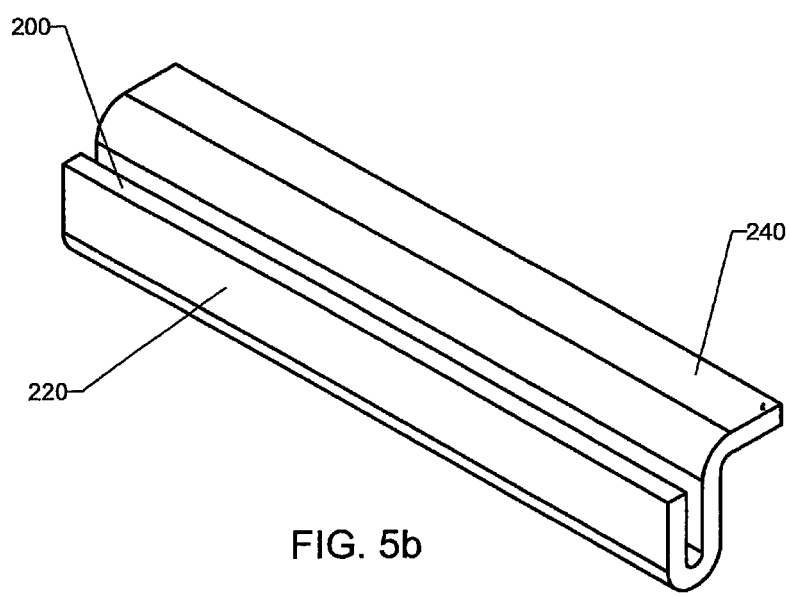

Turning now to FIGS. 5a and 5b, another embodiment of the present invention is shown. Security bracket or clip 200 is disposed between base flange 180 and lid 210. The clip is comprised of multiple flanges that are adapted for securing a top portion of a watthour meter box lid to a portion of a top front flange of a watthour meter box. In this example embodiment, two generally parallel flange segments 220 and 230 are combined with a third flange segment 240 that is generally perpendicular to the first two flanges. Here, parallel bracket segments 220 and 230 encase or surround at least a portion of base flange 180. Once disposed between the top front flange 180 and the box lid 210 with lid top portion 250, the clip becomes trapped between the box lid and the top portion of the box. If prying forces 205 or 208 are applied behind segments 220 or 230 respectively, the reactionary forces are applied to the remaining flanges and consequently, to one or more portions of the box base or box lid. Accordingly, access to the box flange by bending flange 220 down will be frustrated and alternatively access to the box flange will be frustrated preventing lid removal. In various embodiments of the present invention, bracket segments 220, 221, 230, and 240, shown in FIG. 5a, may be made from any combination of materials or from the same piece of material, much like the various embodiments described in FIG. 4a above, and combined or formed into a unitary member incorporating the plurality of flanges.

Figure 6:
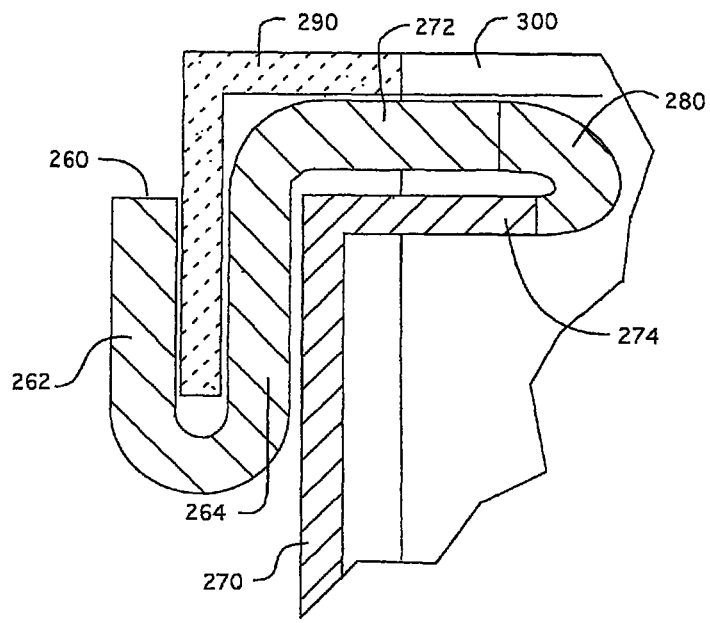
FIG. 6 is a section view showing another example embodiment of the present invention.
Figure 6A:
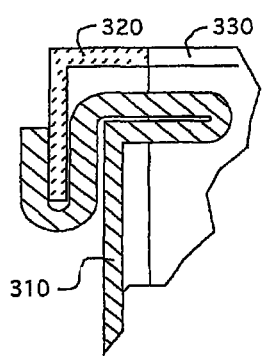
FIG. 6a is a section view showing another example embodiment of the present invention.
Figure 6B:
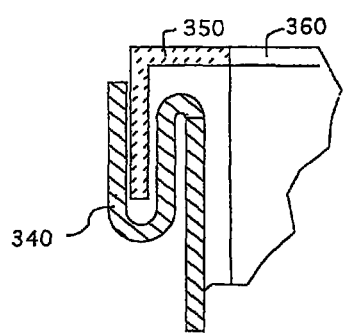
FIG. 6b is a section view showing yet another example embodiment of the present invention.

Turning to FIG. 6, another embodiment of the present invention is shown incorporating security flange 260 with door 270 via joining flange 280 making the combined parts one integrated piece. In various embodiments, 260, 270 & 280 are made from various materials, material thicknesses, or the same material. In some example embodiments of the present invention, flange segment 260 is made from one piece of material and combined with the door 270 via joining segment 280 using various techniques well understood by those with skill in the art. In other embodiments, such as those shown in FIGS. 6a and 6b, door 310 and 340 incorporate a security flange segment, not separately numbered herein, in the meter box door, by forming the entire door and security flange from the same piece of material. When a prying force is applied to the various embodiments described in FIG. 6, the prying forces are distributed into the base flange 290, door 270 and out to and along the edges, not shown, of door 270 and into the meter box base 300. The mechanical advantages inherent in these various embodiments will be obvious to those skilled in the art. FIGS. 6a and 6b illustrate other embodiments of the present invention where the security flange and meter box lid are one integrated piece or "unified component" 310 and 340, installable onto the base and around base flange 330, 320, 360 and 350 respectively, each variation exhibiting similar mechanical advantages to those discussed in FIG. 6 above. Other design variations of FIGS. 6, 6a and 6b, may be conceived by those skilled in the art without significantly changing the intent or overall effectiveness of any given embodiment herein described. Accordingly, no limitations should be applied to the present invention by their omission.

Turning to FIGS. 4, 5a, 5b, it should be noted that lines 172, 174, 176, 178, 232, and 235 are for illustrative purposes only to distinguish between flange segments, their particular location on the flanges of the various embodiments described herein is not important and they do not necessarily indicate a hidden joining surface. It is also noted that in various embodiments of the present invention, as illustrated in FIG. 5a, the bracket securing flange 160, as shown in FIG. 4a, is not required.

With respect to the above description then, it is to be realized that the optimum dimensional relationships for the various flange segments, to include variations in size, materials, shape, form, function and manner of operation, assembly and use, are deemed readily apparent and obvious to one skilled in the art, and all equivalent relationships to those illustrated in the figures and described in this specification are intended to be encompassed by the present invention.

In various embodiments of the present invention, bracket 60 from FIG. 4a and bracket 200 from FIG. 5a and all other embodiments herein described, increase the overall security of a given meter box assembly by effectively distributing prying forces throughout portions of the security flange and meter box assembly. For example, turning to FIG. 4a, in various embodiments, bracket securing flange 160 works in conjunction with flange segments 145 and 150 to distribute forces throughout the entire base flange, lid, security flange combination. When a thief tries to pry base flange 100 and flange 60 upward and away from lid 70, parallel flange 145 contacts at least a portion of base flange 100 and securing flange 160 contacts at least a portion of door 70 including but not limited to any surface portions along flange 170 or along the inside of door 70. In some embodiments of the present invention, under prying forces, perpendicular flange 150 and securing flange 160 "pinch" door flange 170. In other embodiments of the present invention, securing flange 160 contacts only the inside surface of door 70. In multiple embodiments, depending on how each flange segment is sized, the combination of flange segments may contact any combination of portions of surfaces throughout the entire base flange 100, base 80, door 70, door flange 170 and flange 60 combination as shown in FIG. 4a and similarly throughout the surface combinations shown in FIG. 5a.

Figure 7A:
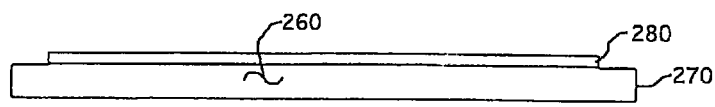
FIG. 7a shows a front view of one example of a unitary member including at least a plurality of flange segments.
Figure 7B:
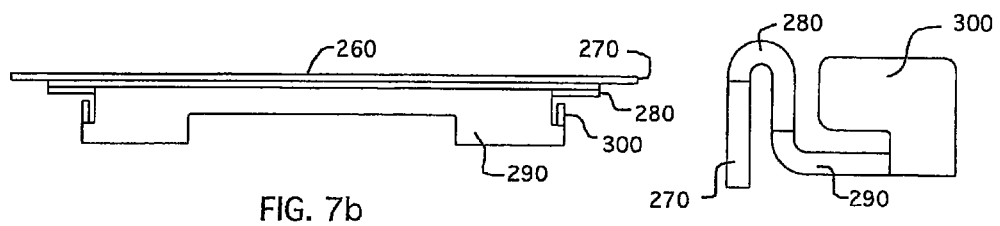
Figure 7D:
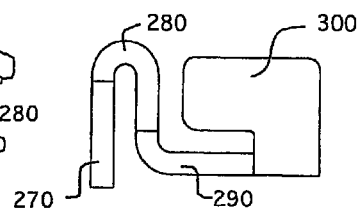
FIG. 7d shows a side view of the same example embodiment.
Figure 7C:
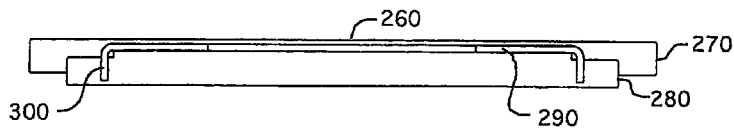
FIG. 7c shows a rear view of the same example embodiment.
Figure 8:
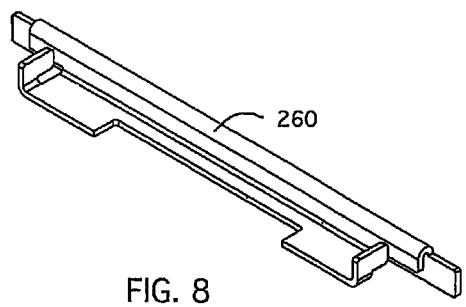
FIG. 8 shows a three dimensional view of the same example embodiment.

Turning now to FIG. 7a through FIG. 7d, one embodiment of the present invention is shown. FIG. 7a shows a front view of a security bracket 260, FIG. 7b shows a top view, FIG. 7c shows a rear view, and FIG. 7d shows a side view. For further illustrative purposes, FIG. 8 shows a three dimensional view of the same sample embodiment. In FIG. 7a through FIG. 7d, flange segments 270, 280, 290 and 300 form a unitary member 260 similar to the unitary members in the various embodiments described above. It should be noted that even though two integrated opposed tension receiving members 300 are shown, in various other embodiments of the present invention, there is only one integrated opposed tension receiving member 300 distributed somewhere along flange segment 290. In other embodiments, there are more than two integrated opposed tension-receiving members 300 distributed somewhere along flange segment 290. It should be understood that the designs shown here are only a few of the many variations that are possible for the present invention. When describing one embodiment as being similar to another embodiment, no limitation on that embodiment should be implied. The only important facet to the design of any embodiment described herein is that each security flange be designed to fit in the gap present between a given base flange and door when a given door is installed onto a given base. It should also be understood that all other integrated opposed tension-receiving member embodiment variations that would be obvious to those with skill in the art, are herein incorporated without further discussion.

Figure 9:
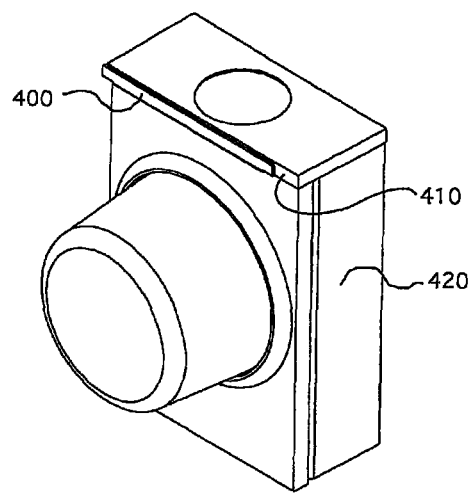
FIG. 9 is a watthour meter box assembly with another example embodiment of an installed security bracket.
Figure 9A:
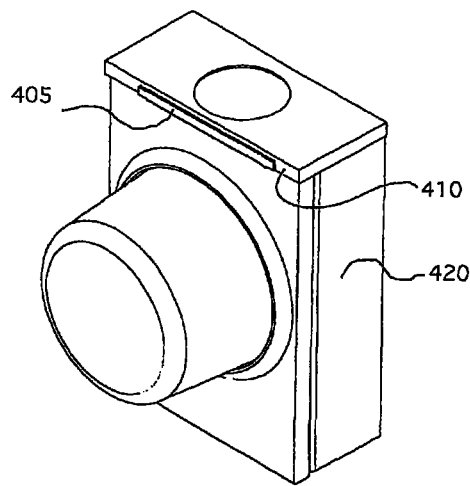
FIG. 9a shows another alternative embodiment of an installed security bracket.

It should also be noted that even though security flange 60 in FIG. 2 is shown covering the entire length or span of the base flange, not shown, of base 50, this is not a necessary limitation to the present invention. For illustrative purposes, FIG. 9 shows one alternative embodiment of the present invention where security bracket or clip 400 spans only a portion of the front segment of the base flange 410 on base 420, the placement of clip 400 along the span of base flange 410 not being important. As another example embodiment, FIG. 9a shows another alternative embodiment where clip 405 covers less of the span of base flange 410 and clip 405 is generally centered along the same span.

In various embodiments of the present invention, security flanges are made from materials that have little or no electrical conductivity. In these embodiments, materials are chosen so that if a security flange comes into contact with electric power lines such as those typically found inside an installed watthour meter box, the chances of an electrical short circuit will be reduced, along with the possible human and physical damage.

In various other embodiments, the security flange is manufacture from materials that may be electrically conductive. In some embodiments of the present invention, the security flange is made from steel. In other embodiments, the steel is case hardened to frustrate a thief attempting to saw off the front flange of the security flange, such as, for example, flange segment 220 in FIG. 5a. In various other embodiments, the unitary member is manufactured from any selection of materials known to those with skill in the art that would increase the security of a given box assembly. To improve safety and prevent short circuits as described above, electrically conductive materials, in various embodiments, are coated with another material with little or no electric conductivity.

Techniques for coating material including powder coating and rubber coating are well known in the art. How the brackets in the present invention's various embodiments may be coated is not important to the present invention and no limitations should be inferred from a particular technique not being mentioned. If new technology is developed for coating material, the new technique or techniques shall be considered equivalent to the techniques currently known in the art and herein incorporated. The only important aspect of the coating is that it limit electric conductivity so as to improve the safe handling and installation of a given security bracket, not the details of the coating technique itself.

Figure 11B:
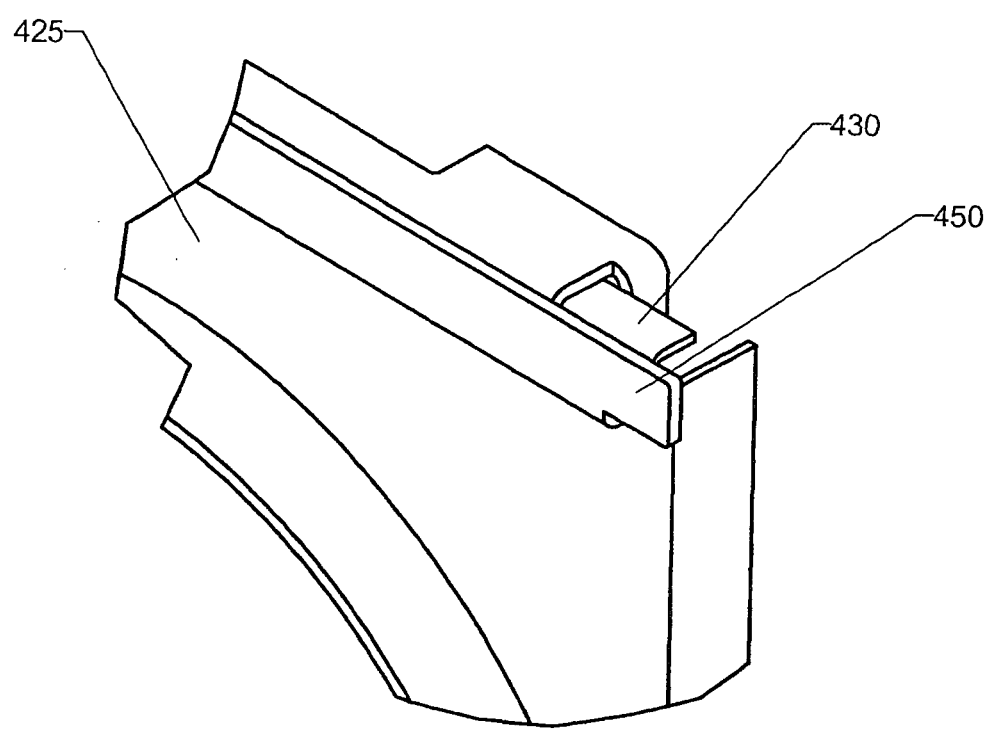
FIG. 11b shows a front section view of the same door with one example embodiment of the present invention in stalled on the door's top.

Unitary member or "security flange" installation is performed in numerous ways. For example, in one embodiment, shown in FIG. 4a, where flange 140 and 145 pinch lip 170, as discussed above, an installer installs the clip around the lip 170 where the clip is held in place by the pinching force, then a door is installed, trapping the clip between the base and lid. Installing unitary members, described in various embodiments, onto a door flange or bracket 430 as seen in FIGS. 10 and 10a may be performed by inserting the bracket securing flanges 300, such as those seen in FIG. 7a through FIG. 7d, not shown in FIG. 10 or FIG. 10a, into the void 435 separated by the termination of the lid top flange 430 and the lid side flange 440. As illustrated in FIGS. 11a and 11b, the bracket 450 is then slidably positioned to any location along lid top flange 430 on the meter box lid 425 resulting in the bracket securing flanges 460 catchably surrounding the lid top flange 430. After the security flange is installed onto a door, the door is installed onto a given meter box base such that a portion of the security flange encases a portion of the base top flange. The door is then secured to the bottom or side of the base by various means well known in the art.

Figure 12:
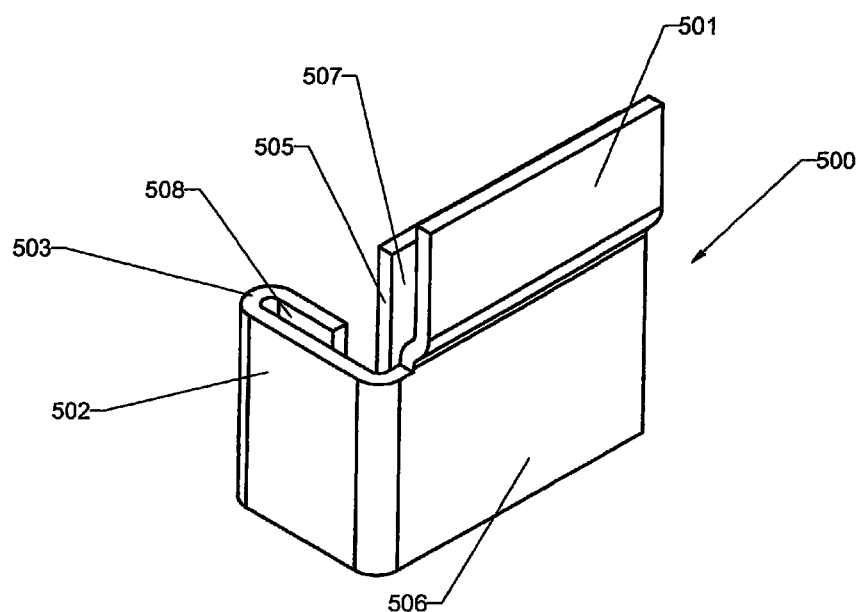
FIG. 12 shows a three dimensional view of another alternative embodiment.
Figure 13:
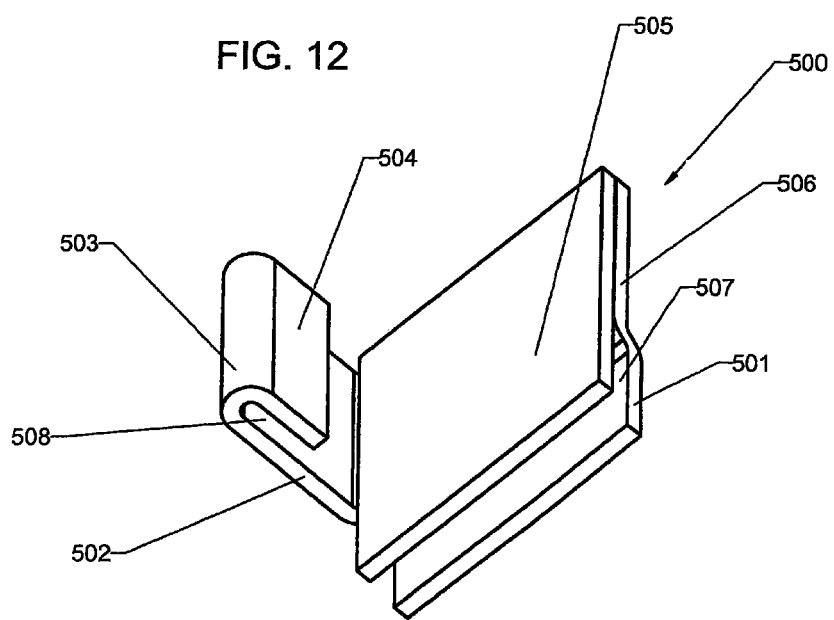
FIG. 13 shows yet another three dimensional view of the alternative embodiment
Figure 14:
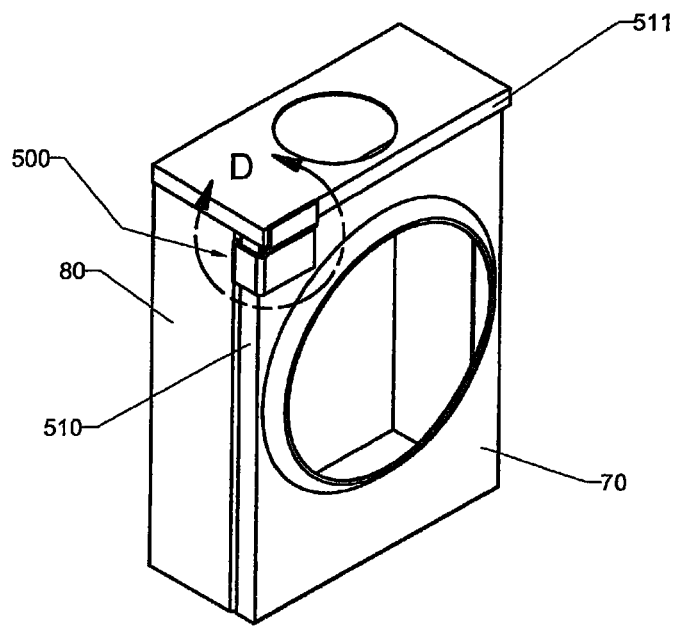
FIG. 14 shows a three dimensional view of the alternative embodiment installed onto a watthour meter box.
Figure 15:
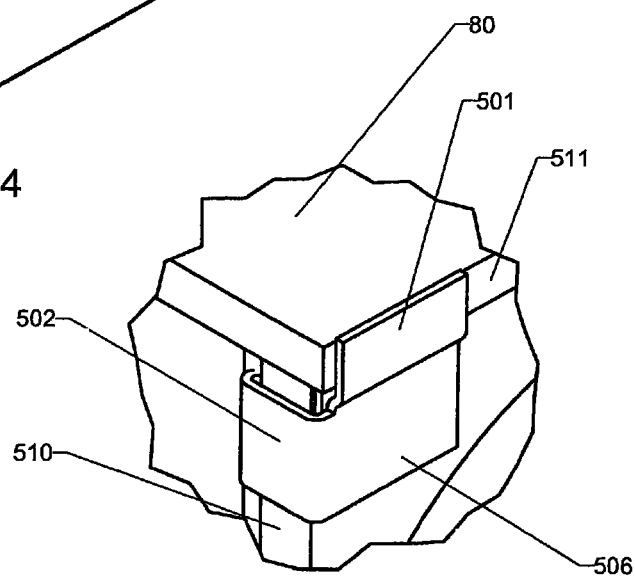
FIG. 15 shows an isolated close-up view of the alternative embodiment installed onto a watthour meter box.

In FIGS. 12, 13 and 14, an alternate embodiment is shown. Security member 500 is comprised of multiple flanges adapted for securing a portion of the top front flange 511 of a watthour meter box as shown in FIGS. 14 and 15. In this embodiment, security flange 501, side flange 502, and rear retaining flange 505 are joined to front flange 506. Flange 501, 505, and flange 506 are configured in a generally parallel relationship with each other. Side retaining flange 504 is attached to side flange 502 by joining flange 503. Flange 502 and 504 is generally perpendicular to front flange 506. Referring to FIGS. 16, 17, and 18, a void 508, defined by side retaining flange 504 and side flange 502, is adapted to receive lid side flange 510. Rear retaining flange 505 is secured to the meter box lid 70 with adhesive. Other securing methods may be used, such as bolting, riveting, or screwing, just to name a few. All known securing methods including but not limited to welding, bonding, and mechanical connection are herein incorporated by reference. Welding, bonding, and mechanical connection being only illustrative examples meant as a simple, partial list of all known securing methods known to those with skill in the art.

As the lid 70 is installed onto the base 80, rear retaining flange 505 becomes trapped between meter box base flange 511 and the meter box lid 70; simultaneously, the meter top front flange is received into the void 507 defined by the security flange 501 and the rear retaining flange 505. When the lid is fully installed, security flange 501 surrounds a portion of the base flange 511. If there is an attempt to pry the security member 500 from the lid 70, flanges 502, 503, and 504 apply reaction forces to a portion of the lid side flange 510, and concurrently, the rear retaining flange 505 is adapted to apply reaction forces to the base flange 511, thus aiding in the retention of security member 500. This embodiment is not limited to the illustrations shown; the security member may be constructed from a single plate that is formed, or multiple pieces that are joined together.

Another example embodiment not shown provides an apparatus for deterring forced entry into a utility service enclosure. Such a utility service enclosure may be used in the electric, gas, water, cable, TV utility industries or in other utility industries. The apparatus includes a securing member adapted to be retained on the utility service enclosure, with the utility service enclosure having a lid, a base and a lid-retaining member and the securing member having a structural member for reinforcing a lid-retaining member. In one example embodiment, the lid-retaining member includes at least a portion of a top of the utility service enclosure. In one other example embodiment, the securing member is retained on the utility service enclosure via a retaining flange adapted to engage a portion of a top of the utility service enclosure lid. In another example embodiment, the securing member further includes at least a structural element adapted to receive a top front flange of the utility service enclosure base. Another example embodiment of the apparatus provides the lid-retaining member includes at least a top front flange of the utility service enclosure base while another example embodiment provides the lid-retaining member includes at least a portion of a top of the utility service enclosure lid.

In another example embodiment all structures known to those with skill in the art which could serve as lid-retaining members are herein incorporated by reference.

Another example embodiment provides a method for deterring forced entry into a utility service enclosure including retaining a securing member on the utility service enclosure, the utility service enclosure including at least a lid, a base, and a lid-retaining member; and reinforcing the lid-retaining member with the securing member.

Another example embodiment provides a system for deterring forced entry into a utility service enclosure including at least: means for retaining a securing member on the utility service enclosure, the utility service enclosure including at least a lid, a base and a lid-retaining member; and means for reinforcing the lid-retaining member with the securing member.

Figure 4B:
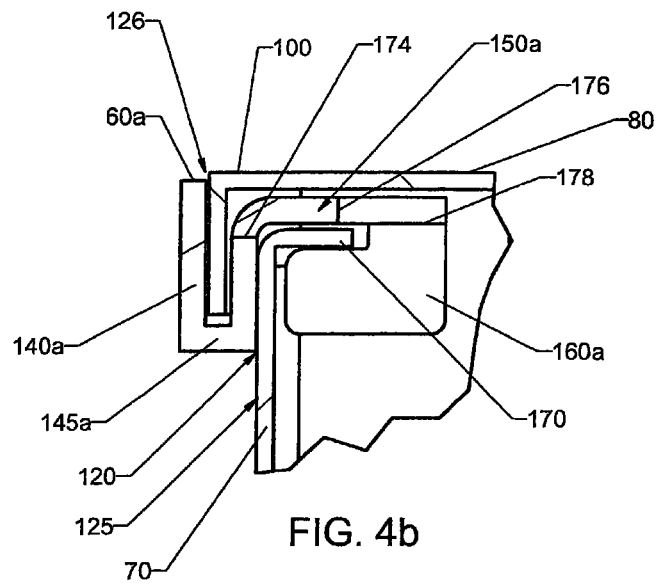
FIG. 4b is a section view from the box assembly in FIG. 3, showing another example embodiment of a reinforcing member.

In another example embodiment shown in FIG. 4b, a securing member 60a includes at least first 140a, second 145a, and third 150a flange members. However, the shape, size, dimension and configuration are not limited to that shown in FIG. 4b. For example, the flanges 140a, 145a, 150a could have a similar configuration and shape as flanges 140, 145, and 150 as in FIG. 4a. The first and second flange members are generally parallel to each other, and the third flange member is generally perpendicular to the first and the second flange members. The third flange member is shaped to engage the top portion of a utility service enclosure lid, such as for example a meter box lid 70. Another example embodiment of the apparatus provides at least fourth flange member 160a wherein the fourth member acts as an integrated opposed tension-receiving member. However, a plurality of flange members could be used, each flange member acting as an integrated opposed tension-receiving member. In an example embodiment, the fourth flange member 160a lies in a plane at least substantially orthogonal with respect to the third flange member, and wherein a top portion of the utility service enclosure lid 70 includes at least a top lip 170. The third flange member 150a and the fourth flange member 160a cooperatively define a slot such that at least a portion of the top lip 170 is releaseably captured within the slot when the securing member 60a is attached to the top lip 170. In this way, the securing member 60a may be retained between the top front flange 100 of the utility service enclosure base 80 and the top lip 170 of the utility service enclosure lid so that when the securing member is subjected to prying forces, the fourth flange member 160a and third flange member 150a cooperate to pinch the top lip therebetween so as to counter the prying forces, and whereby the second flange member 145a, third flange member 150a and fourth flange member 160a cooperatively retain the securing member 60a on the top lip 170 of the utility service enclosure lid so as to aid in preventing the securing member from inadvertently falling into the interior of the utility service enclosure when the lid 70 removed from or installed onto the base 80. With such a configuration, the third flange member 150a is in functional cooperation with the fourth flange member 160a to inhibit deformation of an enclosure structural member, such as for example flange 100, when subject to prying or other forces.

In an example embodiment, FIG. 4b illustrates a securing or reinforcing member 60a including a receiving member 140a, 145a adapted to minimize access to any gap 125 between the receiving member 140a, 145a and a utility service enclosure lid 70 and to any gap 126 between the receiving member and a utility service enclosure base flange 100. Such a configuration makes it difficult for a crow bar, screw driver or other tool to be inserted into gaps 125, 126 in an attempt to pry or force the utility service enclosure base flange 100 from lid 70.

Another example embodiment of a apparatus for strengthening a utility service enclosure includes at least a reinforcing member adapted to securely interengage a structural portion of a utility service enclosure lid to a structural portion of the utility service enclosure base, wherein the reinforcing member cooperatively secures the structural portion of the utility service enclosure lid and the structural portion of the utility service enclosure base.

Another example embodiment includes a securing member having a structural element, or in some embodiments a member, which reinforces the lid-retaining member by engaging, selectively contacting or substantially surrounding the lid-retaining member or which is adapted for being disposed on the lid-retaining member.

In various other embodiments, not shown, the given security flange is disposed onto the lid, or alternatively around the base flange, prior to door installation. The door is then installed onto the box base, trapping the security flange between the door and base flange.

In other embodiments, the security flange or unitary member is installed onto the box base using fasteners attached to or through the base's top. The list of possible fasteners used to secure a given member to a box base is so extensive as to not be practical to list. It would be obvious to those of skill in the art that any number of fasteners in various embodiments might be used without departing from the spirit of the current invention.

In other embodiments, a member is disposed onto the top of a given box base using hand held tools to hold the member in place while the lid is installed. In other embodiments, the member is welded to the top of the box base. In other embodiments, the member is bonded to the top of the box base using any one of a plethora of various adhesives well known in the adhesives art. In other embodiments, the member is installed onto the top of the box base during the box base manufacturing process using industrial tooling, this box base being used for new meter box assembly installations or as a replacement to old meter box bases. Is should be noted that methods to secure a member during base manufacturing could included all attachment methods previously mentioned as well as any number of other methods available in the manufacturing arts.

The present invention provides several advantages over the prior art. The present invention provides additional security to a watthour meter box. The present invention provides a watthour meter security device that encases and protects the top front flange of a watthour meter box base. The present invention provides a watthour meter security device that can be installed without any tools. Several embodiments of the present invention provide a watthour meter security device that will not unintentionally become dislodged from, certain types of watthour meter box lids. The present invention provides a watthour meter security device that will not interfere with the normal operation of the lid. The present invention provides a watthour meter security device that may be incorporated into a currently installed watthour meter box assembly without requiring the removal and replacement of the existing base.

It should be noted that the design described does not limit the scope of the embodiments of invention; the number of various elements may change, or various components may be added or removed to the above-described concept.

The foregoing disclosure and description of embodiments of the invention is illustrative and explanatory of the above and variations thereof, and it will be appreciated by those skilled in the art, that various changes in the design, organization, order of operation, means of operation, equipment structures and location, methodology, the use of mechanical equivalents, such as different types of components than as illustrated whereby different steps may be utilized, as well as in the details of the illustrated construction or combinations of features of the various elements may be made without departing from the spirit of the embodiments of the invention. As well, the drawings are intended to describe various concepts of embodiments of the invention so that presently preferred embodiments of the invention will be plainly disclosed to one of skill in the art but are not intended to be manufacturing level drawings or renditions of final products and may include simplified conceptual views as desired for easier and quicker understanding or explanation of embodiments of the invention. As well, the relative size and arrangement of the components may be varied from that shown and the embodiments of the invention still operate well within the spirit of the embodiments of the invention as described hereinbefore and in the appended claims. Thus, various changes and alternatives may be used that are contained within the spirit of the embodiments of the invention. It is therefore desired that the invention not be limited to these embodiments, and it is intended that the appended claims cover all such modifications as fall within the true spirit and scope of the invention.

Accordingly, the foregoing specification is provided for illustrative purposes only, and is not intended to describe all possible aspects of the example embodiments of the invention. It also will be appreciated by those skilled in the art, that certain various changes in the ordering of steps, ranges, interferences, spacings, components, hardware, and/or attributes and parameters, as well as in the details of the illustrations or combinations of features of the methods and system discussed herein, may be made without departing from the spirit of the embodiments of the invention. Moreover, while various embodiments of the invention have been shown and described in detail, those of ordinary skill in the art will appreciate that changes to the description, and various other modifications, omissions and additions may also be made without departing from either the spirit or scope thereof.

What is claimed is:

1. A watthour meter box security device, the watthour meter box comprising a typical watthour meter box assembly having an interior, the watthour meter box assembly comprising a watthour meter box base and a watthour meter box lid, the base comprising bottom edges and a top front flange and the lid comprising at least a top portion, bottom portion, and side portions, wherein a portion of the top portion of the watthour meter box lid is disposed under the top front flange, and wherein the top front flange is disposed exterior to the portion of the top portion of the watthour meter box lid, the security device comprising:

a unitary member comprising a plurality of flange members, wherein the unitary member secures a portion of a top portion of a watthour meter box lid to a portion of a top front flange of a watthour meter box base; and wherein a first portion of the unitary member comprising the plurality of flange members is shaped to engage the portion of the top front flange of the watthour meter box base.

2. The security device in claim 1, wherein a second portion of the unitary member is shaped to engage the portion of the top portion of the watthour meter box lid.

3. The security device in claim 2, wherein the second portion catchably surrounds the top portion of the watthour meter box lid.

4. The security device in claim 1, wherein the unitary member is combined with the watthour meter box lid such that the watthour meter box lid and unitary member are one integrated piece.

5. The security device in claim 1 wherein the unitary member is made from steel.

6. The security device in claim 5, wherein the steel is case hardened.

7. The security device in claim 1, wherein the unitary member is coated with a material having low electrical conductivity.

8. The security device in claim 7, wherein the material is a powder coat.

9. The security device in claim 7, wherein the material is rubber.

10. A watthour meter box security device, the watthour meter box comprising a typical watthour meter box assembly having an interior, the watthour meter box assembly comprising a watthour meter box base and a watthour meter box lid, the base comprising bottom edges and a top front flange and the lid comprising at least a top portion, bottom portion, and side portions, wherein a portion of the top portion of the watthour meter box lid is disposed under the top front flange, and wherein the top front flange is disposed exterior to the portion of the top portion of the watthour meter box lid, the security device comprising:

a unitary member comprising a plurality of flange members, wherein the unitary member secures a portion of a top portion of a watthour meter box lid to a portion of a top front flange of a watthour meter box base, wherein the plurality of flange members comprises a first, second and third flange member, wherein the first and second flange members are generally parallel to each other;

wherein the third flange member is generally perpendicular to the first and the second flange member, and wherein the third flange member is shaped to engage the top portion of the watthour meter box lid.

11. The security device in claim 10, further comprising a fourth flange member wherein the fourth member acts as an integrated opposed tension-receiving member.

12. The security device in claim 10, wherein each of the plurality of flange members acts as an integrated opposed tension-receiving member.

13. A method for installing a watthour meter box security device on a watthour meter box, the watthour meter box comprising a typical watthour meter box assembly having an interior, the watthour meter box assembly comprising a watthour meter box base and a watthour meter box lid, the base comprising bottom edges and a top front flange and the lid comprising at least a top portion, bottom portion, and side portions, wherein a portion of the top portion of the watthour meter box lid is disposed under the top front flange, and wherein the top front flange is disposed exterior to the portion of the top portion of the watthour meter box lid, said method comprising:

disposing a unitary member comprising a plurality of flange members between a portion of a top portion of a watthour meter box lid and a portion of a top flange of a watthour meter box base, wherein the unitary member secures the portion of the top portion of the watthour meter box lid to the portion of the top front flange of the watthour meter box base, and wherein a first portion of the unitary member comprising the plurality of flange members is shaped to engage the portion of the top front flange of the watthour meter box base.

14. The method for installing a security device in claim 13, wherein the member is in functional cooperation with the portion of the top front flange of the watthour meter box base.

15. The method for installing a security device in claim 13, wherein the member is in functional cooperation with the portion of the top portion of the watthour meter box lid.

16. The method for installing a security device in claim 13, wherein the member is disposed by hand.

17. The method for installing a security device in claim 13, wherein the member is disposed by welding.

18. The method for installing a security device in claim 13, wherein the member is disposed via fasteners.

19. The security device in claim 13, wherein a second portion of the unitary member is shaped to engage the portion of the top portion of the watthour meter box lid.

20. The security device in claim 19, wherein the second portion catchably surrounds the top portion of the watthour meter box lid.

21. The security device in claim 1, wherein at least some of the plurality of flange members are substantially disposed between the portion of the top portion of the watthour meter box lid and the portion of the top front flange of the watthour meter box base.

22. The security device in claim 1, wherein the unitary member further comprises a first, second and third flange member, wherein the first and second flange members are generally parallel to each other, and wherein the third flange member is generally perpendicular to the first and the second flange member.

23. The security device in claim 22, wherein the third flange member is shaped to engage the top portion of the watthour meter box lid.

24. The security device in claim 22, further comprising a fourth flange member wherein the fourth member acts as an integrated opposed tension-receiving member.

25. The security device in claim 22, further comprising a plurality of flange members, each member acting as an integrated opposed tension receiving member.

26. The security device in claim 24, wherein the second, third, and fourth flange member are cooperatively attachable to a top lip of the watthour meter box lid so as to aid in preventing the unitary member from being inadvertently detached upon removal installation of the watthour meter box lid.

27. The security device in claim 24, wherein the third flange member is in functional cooperation with the fourth flange member to inhibit deformation of the watthour meter box when subject to prying or other forces.

28. The security device in claim 1, wherein the unitary member is in functional cooperation with the portion of the top front flange of the watthour meter box base.

29. The security device in claim 1, wherein the unitary member is in functional cooperation with the portion of the top portion of the top portion of the watthour meter box lid.

30. The security device in claim 1, wherein the member is disposed by welding.

31. The security device in claim 1, wherein the member is disposed via fasteners.

32. The security device in claim 1, wherein the unitary member is configured to serve as a reinforcing member to reinforce a structural portion of a watthour meter box lid and a structural portion of the watthour meter box base, and wherein the reinforcing member cooperatively secures the structural portion of the watthour meter box lid and the structural portion of the watthour meter box base.

33. The security device in claim 32, wherein the reinforcing member further comprises a receiving member, the receiving member being adapted to substantially surround a structural portion of the watthour meter box base when the watthour meter box lid is installed onto the watthour meter box base.

34. The security device in claim 32, wherein the reinforcing member is formed to securely interengage a structural portion of the watthour meter box lid to a structural portion of the watthour meter box base, wherein the reinforcing member is in functional cooperation with the structural portion of the watthour meter box base to reinforce the watthour meter box.

35. The security device in claim 32, wherein the reinforcing member is formed to securely interengage a structural portion of a watthour meter box lid to a structural portion of the watthour meter box base, and wherein the reinforcing member is in functional cooperation with the structural portion of the watthour meter box lid and the structural portion of the watthour meter box base to reinforce the watthour meter box.

* * * * *